United States Patent [19]

Mahmoud

[11] Patent Number: 4,956,022
[45] Date of Patent: Sep. 11, 1990

[54] CHEMICAL POLISHING OF ALUMINUM ALLOYS

[75] Inventor: Issa S. Mahmoud, Austin, Tex.

[73] Assignee: International Business Machines Corporation, Armonk, N.Y.

[21] Appl. No.: 378,464

[22] Filed: Jul. 12, 1989

Related U.S. Application Data

[63] Continuation-in-part of Ser. No. 145,806, Jan. 15, 1988, abandoned.

[51] Int. Cl.$^5$ .............................................. C23G 1/02
[52] U.S. Cl. ........................................ 134/41; 134/28; 134/42; 252/79.2; 252/79.3; 252/143
[58] Field of Search .................. 134/28, 30, 41, 42; 252/143, 79.3, 79.4, 146, 147, 79.2

[56] References Cited

U.S. PATENT DOCUMENTS

| Re. 32, 661 | 5/1988 | Binns | 134/41 |
|---|---|---|---|
| 3,009,849 | 11/1961 | Bellinger | 156/665 |
| 4,518,519 | 5/1985 | Lott et al. | 134/40 |
| 4,707,191 | 11/1987 | Martinou et al. | 134/3 |
| 4,894,126 | 1/1990 | Mahmoud | 204/58 |

FOREIGN PATENT DOCUMENTS

| 579319 | 7/1959 | Canada | 156/665 |
|---|---|---|---|
| 659747 | 10/1951 | United Kingdom | 156/665 |

OTHER PUBLICATIONS

Wernick and Pinnter, "The Surface Treatment and Finishing of Aluminum and its Alloys", Robert Draper Ltd., vol. 1, 4th edition, 1972, pp. 112–120.
Quagliano, J. V., "Chemistry", Second Edition, Prentice Hall, Inc., 1964, pp. 633–636.
Fontana and Greene, "Corrosion Engineering", Second Edition, McGraw-Hill Inc., 1978, pp. 16–10, 22–23.

Primary Examiner—Asok Pal
Attorney, Agent, or Firm—Andrea P. Bryant

[57] ABSTRACT

A chemical polishing bath and process are disclosed for pretreating aluminum and its alloys prior to plating or anodizing operations, which bath and process produce a mirrorlike finish.

12 Claims, No Drawings

CHEMICAL POLISHING OF ALUMINUM ALLOYS

This application is a Continuation-in-Part of Application Ser. No. 07/145,806, filed Jan. 15, 1988, now abandoned.

CROSS REFERENCE TO RELATED APPLICATIONS

The instant invention may be used in combination with that described in concurrently filed commonly assigned U.S. patent application Ser. No. 145,805, now U.S. Pat. No. 4,894,126.

BACKGROUND OF THE INVENTION

1. Field of the Invention

The invention relates to chemical polishing of aluminum alloys. More specifically, it relates to a polishing bath composition including phosphoric acid, nitric acid, sodium nitrate and water.

2. Description of the Prior Art

Both patent literature and general scientific literature contain many references related to polishing aluminum. The Metal Finishing Handbook (Metals and Plastic Publishing Company) and Wernick and Pinner *Surface Treatment of Aluminum*, 4th Ed., 1974, pp. 120-146, discuss polishing at length. Prior art polishing methods cause the formation of smut on the surface of the workpiece which necessitates the use of additional process steps, either mechanical or chemical, to remove. These additional steps increase the total number of manufacturing steps and result in overall higher cost.

SUMMARY OF THE INVENTION

A bath formula is presented which produces mirror finishes on both wrought, heat-treatable and non-heat treatable aluminum alloys. Cleaned and rinsed aluminum workpieces are chemically polished in a bath comprising phosphoric acid, nitric acid, sodium nitrate and water for about 1 to 2 minutes at a temperature in the range of from about 80 to 90 degrees centigrade. After polishing, the workpieces are rinsed in warm deionized water for about 1 to 2 minutes. The result is an aluminum workpiece suitable for immediate use as in decorative applications or ready for another step, such as anodizing as part of a manufacturing process for printed circuit boards. This polishing bath produces microetched surfaces which increase nucleation sites, an important consideration for even, anodic coatings.

DESCRIPTION OF THE PREFERRED EMBODIMENT

A bath in which aluminum alloy workpieces may be immersed for chemical polishing comprises 784 milliliters of phosphoric acid, 98 milliliters nitric acid, 40 grams sodium nitrate and 118 milliliters water.

The total immersion period is preferably 1 to 2 minutes at a temperature of 80 to 90 degrees centigrade. Prior to immersion, the aluminum alloy workpieces must be cleaned, preferably either in an organic solution of the halogenated type or in a mild alkaline solution. The workpiece is then rinsed in water at room temperature. Upon removal from the polishing bath, the workpieces are rinsed in warm deionized water at a temperature of about 120 to 130 degrees Fahrenheit for 1 to 2 minutes.

While the above parameters yield optimum results, satisfactory results may be obtained with some latitude allowed in the amount of the bath constituents as long as the amount used is somewhere between 75% and 125% of the preferred value.

It is believed that this formulation is based on the oxidizing power theory whereby at this concentration level, the oxidizing power of the solution is sufficient to remove heat scale, oxides and other contaminants. Sodium nitrate provides continual replenishment of nitrate ions in the nitric acid in the solution as it is consumed or degraded, thus maintaining a longer useful life of the polishing bath. Nitric acid is present in low enough concentration to avoid severe etching of the workpieces.

Chemical polishing of metals, in general, is a process involving simultaneous oxidations and dissolutions at the metal surface. Concentration of the oxidizing species, that is oxidizing power, in the polishing solution is of utmost importance. Low concentration, low oxidizing power, of the oxidizing species such as when dilute acids are used, results in low dissolution rate at the aluminum metal surface. Therefore, no polishing is obtained in such baths.

In the instant invention, the oxidizing species is supplied by the nitric acid and sodium nitrate. The oxidizing species is the nitrate ion. In aqueous solutions, nitric acid and dissociates in one of two forms at room temperature:

$$HNO_3 \rightleftharpoons H_3O^+ + NO_3^-$$

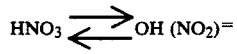

$$HNO_3 \rightleftharpoons OH(NO_2)^=$$

With elevated temperature, such as taught in the operating conditions of the instant invention, nitric acid also undergoes some degradation in the form:

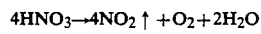

$$4HNO_3 \rightarrow 4NO_2 \uparrow + O_2 + 2H_2O$$

This degradation presents one of two problems; first, surface pitting, and second, low dissolution rate leading to smut formation. In order to compensate for the degradation of the nitric acid, sodium nitrate is added to provide a concentration of nitrate ions maintained at a level to produce the desired results. In aqueous solutions:

$$NaNO_3 \rightarrow Na^+ + NO_3^-$$

It should also be noted that in concentrated nitric acid solution without the addition of nitrate ions, passivation occurs which results in no polishing of the aluminum surface.

While the particular bath formulation is the result of an effort to perfect pre-treatment for aluminum workpieces prior to anodization, it has been found that the chemical polishing bath of the invention is also effective for producing a final finish on aluminum alloys for use in decorative applications.

A further advantage is that the chemical polishing bath of the invention is also useful for removing burrs present at the surface following stamping, drilling and other cutting steps. The disclosed chemical polishing formula results in aluminum having a very smooth surface, making it suitable for the manufacture of other devices requiring great precision, such as magnetic storage media surfaces.

When chemical polishing is conducted in accordance with the invention prior to plating aluminum, satisfactory results are also obtained. Conventional commercial plating methods often require aluminum alloys to be treated with a phosphate or zincate coating to protect the surface against unwanted oxidation. These coatings are then removed in an atom by atom displacement process during plating. In such processes, bath contamination is always a danger and there is a high cost associated therewith. The present chemical polishing process yields aluminum alloy workpieces having on the surface thereof an extremely thin oxide layer in the range of 10 to 50 Angstroms, which has been found to have no adverse effects on subsequent plating adhesion. In fact, aluminum alloy polished in accordance with the invention have been successfully plated after 6 to 8 months of storage.

Table 1 below, is illustrative of a conventional chemical polishing bath. This prior art bath formula is taken from Wernick & Pinner, The Surface Treatment and Finishing of Alloys, Vol. 1, 1972, 4th ed., pp 122–126.

Smut is caused by lack of sufficient oxidizing power in the polishing bath. The addition of sodium nitrate to the bath of the present invention is believed to maintain the oxidizing power at a level which eliminates both the formation of smut and pitting of the panel's surface. Pitting is typically caused by a very low concentration of nitric acid.

Table 2 illustrates the effect of adding sodium nitrate to the bath formulation over time, while Table 3 is illustrative of the preferred embodiment and practice of the invention. It is to be noted that good results were obtained at each try, while no additions of any bath constituent were made. The only degradation in results occurred when the panel remained in the bath for a time greater than the preferred bath immersion period.

Note in Table 3 that no smut or pitting was observed on the test panels.

The following examples are illustrative of the practice of the present invention.

EXAMPLE 1

Samples of wrought aluminum alloy 6061-T6 were degreased in 1,1,1 trichloroethylene and then treated in a preheated solution having the composition of 784 ml phosphoric acid, 98 ml nitric acid, 40 grams sodium nitrate and 118 ml water, all per liter of solution. The solution temperature was 85 degrees centigrade and the treatment time lasted for 3 minutes. The samples were rinsed in warm deionized water for 1 minute. No smut was formed on the surface of the samples and a mirrorlike appearance was obtained.

EXAMPLE 2

Samples of heat treatable and non-heat treatable aluminum alloys, 1110, 2024, 3000, 5052 and 6063 were treated as in Example 1. No surface smut was found on any of the samples; and again, a mirrorlike finish was obtained.

EXAMPLE 3

Other trials with various aluminum alloys including 7075 and 8086 were carried out as in Example 1 above, with the exception that the temperature of the solution was raised to 90 degrees centigrade. Similar smut free mirrorlike finish results were obtained.

EXAMPLE 4

Concentrations of nitric acid and sodium nitrate were reduced to 75% of their previous values in the polishing bath in Example 1; 75 milliliters nitric acid, 30 grams sodium nitrate. Temperature and treatment period were as in Example 1. Heavy smut was found on workpieces, which smut has then to be removed mechanically.

EXAMPLE 5

Another trial was conducted as in Example 1, with the exception that treatment time was decreased to 2 minutes from 3. Identical results were obtained.

While the invention has been described having reference to a preferred bath composition formulation along with variations in process parameters, those skilled in the art will appreciate that these and other minor changes in composition, concentrations and process parameters may be made without departing from the scope of the invention.

By way of example, potassium nitrate would behave in a manner similar to that of sodium nitrate.

What is claimed is:

1. A method of polishing aluminum alloys comprising the steps of:
   immersing clean aluminum alloy workpieces in a solution consisting essentially of per liter
   from about 588 to about 940 milliliters phosphoric acid;
   73 to 118 milliliters nitric acid;
   30 to 48 grams sodium nitrate;
   88 to 142 milliliters of water;
   for a period of about 0.8 to 3.2 minutes at a temperature in the range of about 80 to 90 degrees centigrade; and
   rinsing the workpieces in deionized water.

2. The method of claim 1 wherein the rinsing step includes:
   maintaining deionized water at a temperature in the range of from about 115 to about 135 degrees Fahrenheit.

3. The method of claims 1 or 2 wherein the immersing step includes:
   immersing a cleaned aluminum alloy workpiece in a solution comprising:
   phosphoric acid in the range of from about 705 to about 862 milliliters;
   nitric acid in the range of from about 90 to about 110 milliliters;
   sodium nitrate in the range of from about 35 to about 45 grams; and
   water in the range of from about 100 to about 130 milliliters.

4. A process for chemically polishing aluminum comprising the sequential steps of:
   cleaning aluminum alloy workpieces;
   rinsing the workpieces;
   immersing cleaned and rinsed workpieces in an aqueous solution consisting essentially of per liter:
   784 ml phosphoric acid, 98 ml nitric acid, 40 g sodium nitrate, for a period of from about 1 to about 2 minutes, at a temperature in a range of from about 80 to about 90 degrees centigrade; and
   rinsing the workpieces in deionized water at a temperature in the range of from about 110 to about 130 degrees Fahrenheit.

5. The process of claim 4 wherein the cleaning step comprises:
   immersing the workpieces in a halogenated organic solution.

6. The process of claim 4 wherein the cleaning step comprises:
   immersing the workpieces in a mild alkaline solution.

7. The process of claims 4, 5 or 6 wherein the first mentioned rinsing step comprises:
   rinsing the workpieces in flowing room temperature water.

8. The method of claim 1 wherein the immersing step includes:
   immersing cleaned aluminum workpieces in a solution comprising per liter
   784 milliliters phosphoric acid, 98 milliliters nitric acid, 40 grams sodium nitrate and 118 milliliters water.

9. The method of claim 8 wherein the immersing step further includes:
   maintaining the temperature of the solution at substantially 80 degrees centigrade.

10. The process of claim 9 wherein the immersing step further includes:
    keeping the workpieces in the solution for 1 to 2 minutes.

11. A chemical polishing bath for aluminum alloys consisting essentially of
    an aqueous solution, maintained at a temperature in the range of 85 to 90 degrees centigrade, said solution containing per liter:
    780 to 790 milliliters phosphoric acid;
    85 to 100 milliliters nitric acid, and
    35 to 45 grams of a nitrate salt for maintaining nitrate ion concentration.

12. The polishing bath of claim 11, wherein the nitrate salt is sodium nitrate.

* * * * *

UNITED STATES PATENT AND TRADEMARK OFFICE
CERTIFICATE OF CORRECTION

PATENT NO. : 4,956,022

DATED : September 11, 1990

INVENTOR(S) : Issa S. Mahmoud

It is certified that error appears in the above-identified patent and that said Letters Patent is hereby corrected as shown below:

Col. 3, line 21, please note that "Table 1" is referenced and not shown, please insert Table 1 as attached hereto;

Col. 3, line 32, please note that "Table 2" is referenced and not shown, please insert Table 2 as attached hereto;

Col. 3, line 40, please note that "Table 3" is referenced and not shown, please insert Table 3 as attached hereto.

UNITED STATES PATENT AND TRADEMARK OFFICE
CERTIFICATE OF CORRECTION

PATENT NO. : 4,956,022

DATED : September 11, 1990

INVENTOR(S) : Issa S. Mahmoud

It is certified that error appears in the above-identified patent and that said Letters Patent is hereby corrected as shown below:

TABLE 1

Bath Composition

15% $H_2O$ / 5% $HNO_3$ / 80% $H_3PO_4$

| PANEL | TIME IN BATH (MIN.) | TEMP.(deg.C) | RESULTS |
|---|---|---|---|
| 1 | 2 | 65 | smut, dull panel |
| 2 | 2 | 75 | smut, semi-bright |
| 3 | 2 | 85 | smut, bright |
| 4 | 5 | 87 | smut, bright |
| 5 | 10 | 90 | smut, bright, streaks and/or grooves |
| 6 | 5 | 90 | same as above |
| 7 | 5 | 90 | same as above |
| 8 | 3 | 85 | smut, pitted surface |
| 9 | 2 | 85 | smut, pitted surface |
| Added 5% $H_2O$ | | | |
| 10 | 2 | 80 | smut, no pitting |

UNITED STATES PATENT AND TRADEMARK OFFICE
CERTIFICATE OF CORRECTION

PATENT NO. : 4,956,022
DATED : September 11, 1990
INVENTOR(S) : Issa S. Mahmoud

It is certified that error appears in the above-identified patent and that said Letters Patent is hereby corrected as shown below:

TABLE 2
$Water/HNO_3/H_3PO_4/NaNO_3$
150 ml/100 ml/700 ml/20 grams

| PANEL | TIME IN BATH (MIN.) | TEMP.(deg.C) | RESULTS |
|---|---|---|---|
| 1 | 2 | 80 | slight smut, shiny |
| 2 | 2 | 80 | slight smut, shiny |
| 3 | 3 | 85 | slight smut, shiny |
| 4 | 5 | 80 | smut, shiny |
| 5 | 5 | 85 | smut, shiny, streaks |
| 6 | 10 | 85 | smut, shiny, grooves |
| 7 | 5 | 85 | smut, shiny, streaks |
| Added 5% $HNO_3$ | | | |
| 8 | 3 | 80 | smut, pitting, shiny |
| Added 15 grams $NaNO_3$ | | | |
| 9 | 3 | 85 | very slight smut, shiny |
| Added 75 ml $H_2O$ | | | |
| 10 | 3 | 85 | very thin smut, shiny |
| Added 10 grams $NaNO_3$ | | | |
| 11 | 2 | 85 | no smut, shiny |
| 12 | 2 | 87 | no smut, shiny |

UNITED STATES PATENT AND TRADEMARK OFFICE
CERTIFICATE OF CORRECTION

PATENT NO. : 4,956,022
DATED : September 11, 1990
INVENTOR(S) : Issa S. Mahmoud

It is certified that error appears in the above-identified patent and that said Letters Patent is hereby corrected as shown below:

TABLE 3

Water/$HNO_3$/$H_3PO_4$/$NaNO_3$ 110 ml/100 ml/ 775 ml/ 40 grams

| PANEL | TIME IN BATH (MIN.) | TEMP.(deg.C) | RESULTS |
| --- | --- | --- | --- |
| 1 | 2 | 80 | mirror-like, no smut |
| 2 | 2 | 80 | mirror-like, no smut |
| 3 | 3 | 85 | mirror-like, no smut |
| 4 | 5 | 85 | streaks, mirror-like |
| 5 | 10 | 85 | grooves, mirror-like |
| 6 | 2 | 85 | mirror-like, no smut |
| 7 | 2 | 85 | mirror-like, no smut |
| 8 | 2 | 85 | mirror-like, no smut |

UNITED STATES PATENT AND TRADEMARK OFFICE
CERTIFICATE OF CORRECTION

PATENT NO. : 4,956,022

DATED : September 11, 1990

INVENTOR(S) : Issa S. Mahmoud

It is certified that error appears in the above-identified patent and that said Letters Patent is hereby corrected as shown below:

| | | | |
|---|---|---|---|
| 9 | 2 | 85 | mirror-like, no smut |
| 10 | 2 | 85 | mirror-like, no smut |

Signed and Sealed this

Fourth Day of August, 1992

Attest:

DOUGLAS B. COMER

*Attesting Officer*     Acting Commissioner of Patents and Trademarks